(12) United States Patent
Yamaguchi et al.

(10) Patent No.: US 12,029,100 B2
(45) Date of Patent: Jul. 2, 2024

(54) METHOD FOR MANUFACTURING DISPLAY DEVICE

(71) Applicant: SHARP KABUSHIKI KAISHA, Sakai (JP)

(72) Inventors: Katsuhiro Yamaguchi, Sakai (JP); Tadashi Nishioka, Sakai (JP); Keiji Aota, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 440 days.

(21) Appl. No.: 17/603,538

(22) PCT Filed: Apr. 19, 2019

(86) PCT No.: PCT/JP2019/016894
§ 371 (c)(1),
(2) Date: Oct. 13, 2021

(87) PCT Pub. No.: WO2020/213174
PCT Pub. Date: Oct. 22, 2020

(65) Prior Publication Data
US 2022/0158145 A1 May 19, 2022

(51) Int. Cl.
| | |
|---|---|
| *H10K 71/00* | (2023.01) |
| *G09F 9/30* | (2006.01) |
| *H10K 59/131* | (2023.01) |
| *H10K 77/10* | (2023.01) |
| *H10K 59/12* | (2023.01) |
| *H10K 102/00* | (2023.01) |

(52) U.S. Cl.
CPC ............ *H10K 71/00* (2023.02); *G09F 9/301* (2013.01); *H10K 59/131* (2023.02); *H10K 77/111* (2023.02); *H10K 59/1201* (2023.02); *H10K 2102/311* (2023.02)

(58) Field of Classification Search
CPC .... H10K 71/00; H10K 59/131; H10K 77/111; H10K 59/1201; H10K 2102/311; G09F 9/301; G09F 9/00; G09F 9/30; H05K 1/189; H05K 2201/10128; Y02E 10/549
See application file for complete search history.

(56) References Cited

U.S. PATENT DOCUMENTS

2005/0237467 A1\* 10/2005 Takaishi .............. G02F 1/13452
349/149
2017/0294621 A1 10/2017 Higano et al.

FOREIGN PATENT DOCUMENTS

JP 2017-187705 A 10/2017

\* cited by examiner

*Primary Examiner* — Kyoung Lee
(74) *Attorney, Agent, or Firm* — ScienBiziP, P.C.

(57) ABSTRACT

A method for manufacturing a display device includes a mounting process in which a frame terminal of a flexible display panel and a counter terminal of a flexible printed circuit substrate are electrically connected by thermocompression bonding. In the mounting process, the thermocompression bonding is performed in a state in which the flexible display panel is folded so that the flexible display panel includes an abutting portion abutting on a mounting stage and a folding portion where the flexible display panel is to be folded over the abutting portion in plan view.

15 Claims, 11 Drawing Sheets

METHOD FOR MANUFACTURING DISPLAY DEVICE

TECHNICAL FIELD

The disclosure relates to a method for manufacturing a display device with a flexible display panel.

BACKGROUND ART

PTL 1 discloses an organic EL display device with a flexible substrate.

CITATION LIST

Patent Literature

PTL 1: JP 2017-187705 A

SUMMARY

Technical Problem

A bendable display device is conceivable to be designed as a foldable display device that can operate in a folded state as an organic EL display device described in PTL 1.

Generally, a flexible display panel of a foldable display device is significantly large in size compared to that of known display devices. Thus, for known display device manufacturing apparatuses, it is difficult to ensure a sufficiently large mounting stage that is used when mounting a flexible printed circuit substrate on a flexible display panel.

Solution to Problem

In order to solve the above-described problem, a method for manufacturing a display device according to the disclosure is a method for manufacturing a display device including a flexible display panel and a flexible printed circuit substrate, the flexible display panel including a display region and a frame region, the frame region including, on a first side thereof, a first terminal region in which a frame terminal is provided, the display region including a scanning signal line and a data signal line, the flexible printed circuit substrate including a counter terminal, the method for manufacturing the display device including a mounting process in which the frame terminal and the counter terminal are electrically connected by thermocompression bonding, wherein, in the mounting process, the thermocompression bonding is performed in a state in which the flexible display panel is folded so that the flexible display panel includes an abutting portion abutting on a mounting stage and a folding portion where the flexible display panel is to be folded over the abutting portion in plan view.

Advantageous Effects of Disclosure

The configuration described above enables the manufacture of a display device with a large display panel as a foldable display device, even with known display device manufacturing apparatuses.

DESCRIPTION OF EMBODIMENTS

First Embodiment

Figure 2:
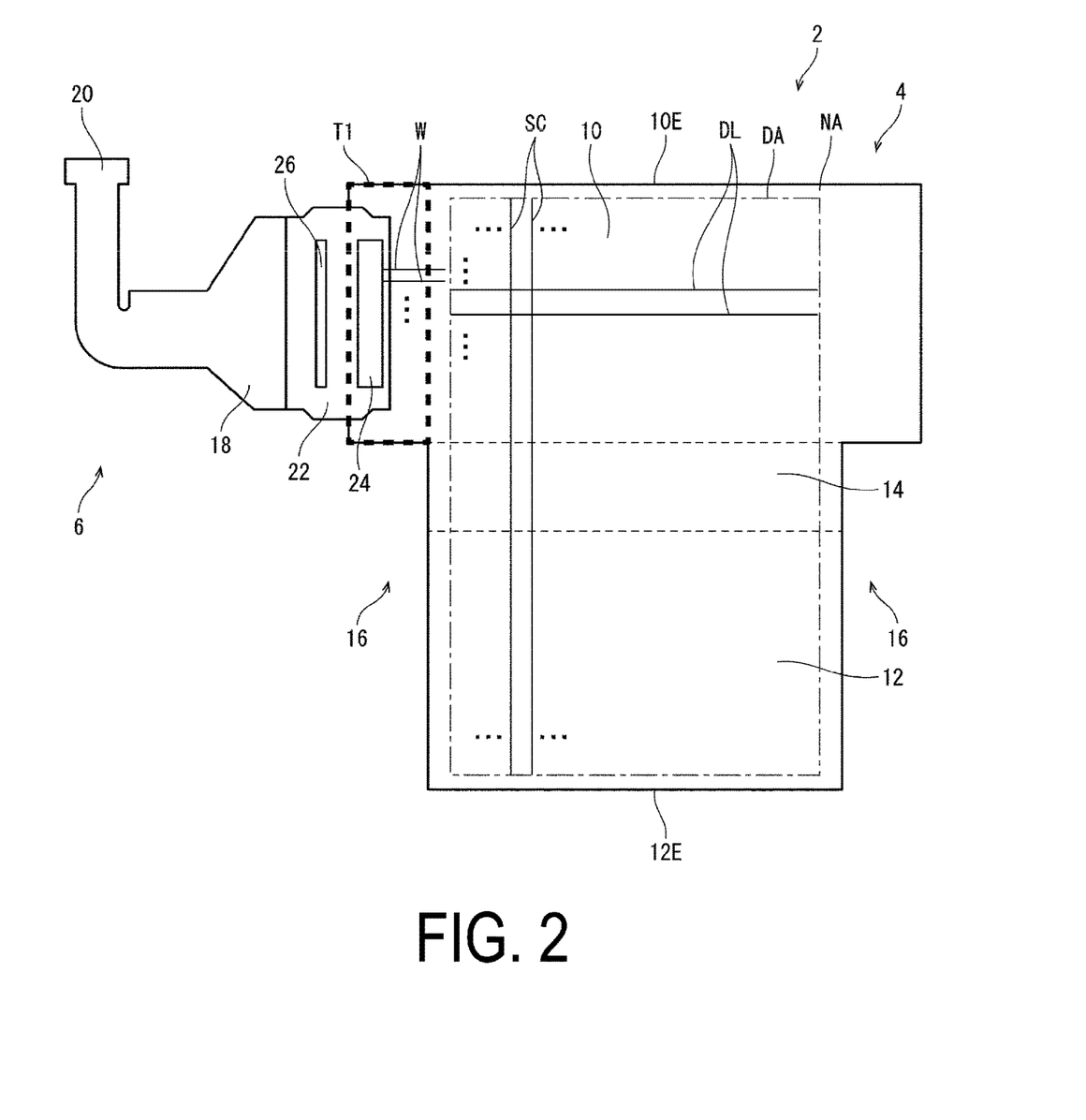
FIG. 2 illustrates a schematic top view of the display device according to the first embodiment.
Figure 3:
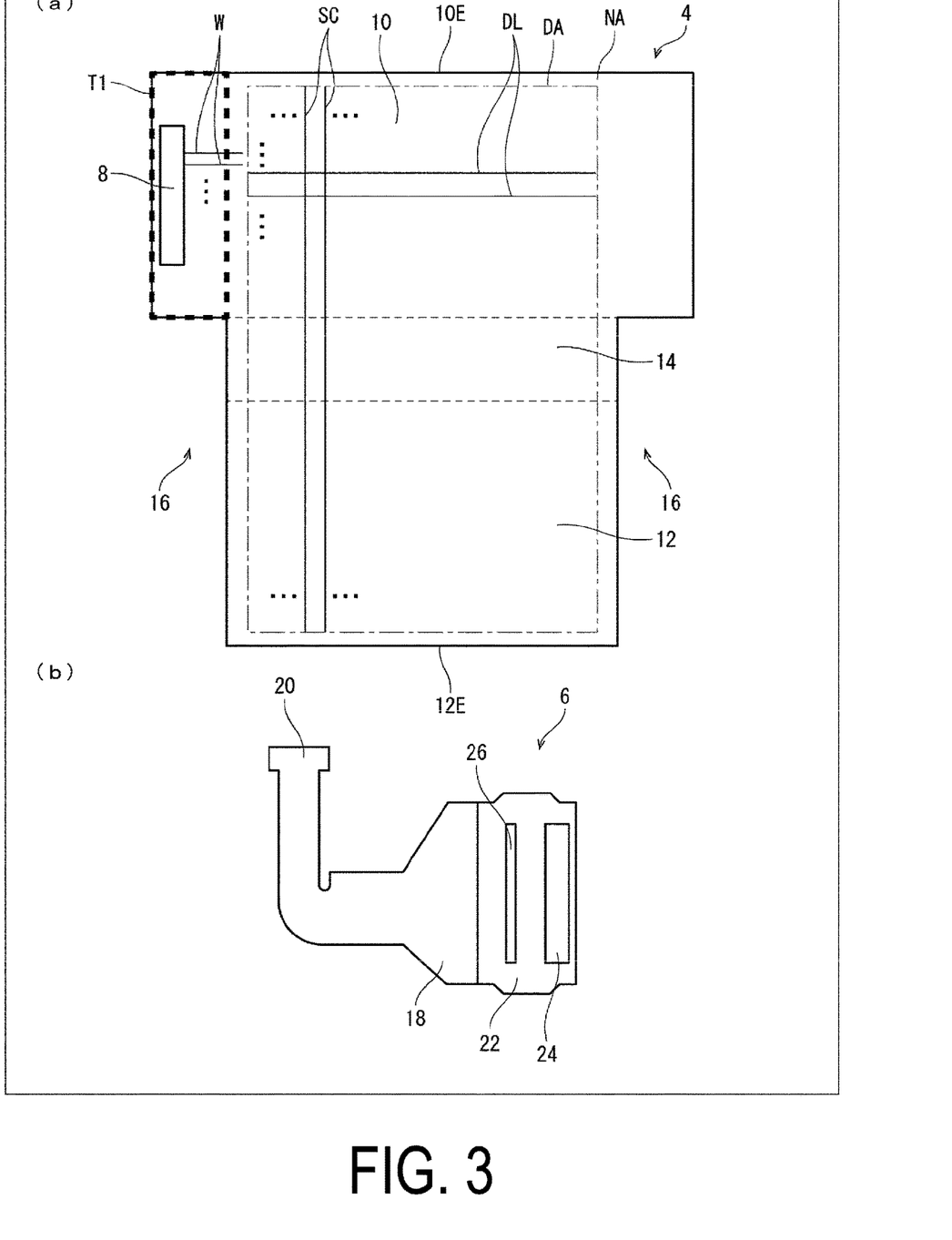
FIG. 3 illustrates schematic top views of a flexible display panel and a flexible printed circuit substrate according to the first embodiment.

A display device 2 according to the present embodiment will be described with reference to FIGS. 2 and 3. FIG. 2 is a schematic top view illustrating the display device 2 according to the present embodiment. FIG. 3 illustrates a schematic top view separately illustrating a flexible display panel 4 and a FPC substrate (flexible printed circuit substrate) 6 provided in the display device 2 illustrated in FIG. 2. (a) of FIG. 3 is a top view illustrating the flexible display panel 4, and (b) of FIG. 3 is a top view illustrating the FPC substrate 6.

As illustrated in FIG. 2, the display device 2 according to the present embodiment includes the flexible display panel 4 and the FPC substrate 6. The display device 2 is obtained by mounting the FPC substrate 6 on the flexible display panel 4.

As illustrated in FIG. 2 and (a) of FIG. 3, the flexible display panel 4 includes a display region DA including a plurality of display pixels and a frame region NA formed around the display region DA. A plurality of data signal lines DL extending from a source driver in the frame region NA and a plurality of scanning signal lines SC extending from a gate driver in the frame region NA are formed in the display region DA. A pixel circuit for driving each display pixel is formed at each of the intersections of the data signal lines DL and the scanning signal lines SC.

The flexible display panel 4 includes a first terminal region T1 provided with a frame terminal 8 at one side of the frame region NA. The frame terminal 8 is connected to a lead wiring line W wired from each driver in the frame region NA. The frame terminal 8 is an external mounting terminal on which a terminal of the FPC substrate 6 is to be mounted. Each of the display pixels in the display region DA is driven by the signal being transmitted from the frame terminal 8 to each of the data signal lines DL and each of the scanning signal lines SC in the display region DA.

The flexible display panel 4 further includes an abutting portion 10, a folding portion 12, and a curved portion 14. The abutting portion 10 includes the first terminal region T1 in the frame region NA. The folding portion 12 and the curved portion 14 include a notch 16 in the frame region NA including a position adjacent to the first terminal region T1.

The abutting portion 10 is a portion of the flexible display panel 4 that abuts on a mounting stage in a mounting process of the flexible display panel 4 and the FPC substrate 6 described below. The folding portion 12 is a portion of the flexible display panel 4 that is folded back to a position overlapping the abutting portion 10 in the mounting process. In the present embodiment, the flexible display panel 4 is sectioned into the abutting portion 10 and the folding portion 12 with the curved portion 14 interposed therebetween.

Note that in the present embodiment, as illustrated in FIG. 2 and (a) of FIG. 3, the abutting portion 10 of the flexible display panel 4 has an end portion 10E of the abutting portion 10 opposite to the folding portion 12 with the curved portion 14 interposed therebetween. Similarly, the folding portion 12 of the flexible display panel 4 has an end portion 12E of the folding portion 12 opposite to the abutting portion 10 with the curved portion 14 interposed therebetween. In the present embodiment, a distance from the end portion 10E to the curved portion 14 may be the same as a distance from the end portion 12E to the curved portion 14.

Note that the curved portion 14 may be a region in which the flexible display panel 4 curves when the actual foldable display device 2 is folded. On the other hand, the curved portion 14 may be different from a region that is curved when the actual foldable display device 2 is folded.

Note that, as illustrated in FIG. 2 and (a) of FIG. 3, the scanning signal lines SC may be formed in common; however, the scanning signal lines SC may be divided into the abutting portion 10 side and the folding portion 12 side in the curved portion 14. Alternatively, the scanning signal lines SC may be divided in a region that is curved when the actual foldable display device 2 is folded. In other words, the scanning signal lines SC may extend, toward the curved portion 14 side, from both the source driver provided in the frame region NA on the abutting portion 10 side and the other source driver provided in the frame region NA on the folding portion 12 side.

As illustrated in FIG. 2 and (b) of FIG. 3, the FPC substrate 6 includes a flexible film 18, a connector 20 formed at one end of the flexible film 18, and a chip on film (COF) substrate 22 formed on the other end of the flexible film 18. The connector 20 may be inserted and mounted on an external device, such as a power supply, external to the display device 2.

The COF substrate 22 includes a counter terminal 24 and an IC chip 26. The counter terminal 24 is formed at an end portion of the COF substrate 22. As illustrated in FIG. 2, the FPC substrate 6 is mounted on the flexible display panel 4 by electrically connecting the counter terminal 24 of the FPC substrate 6 and the frame terminal 8 of the flexible display panel 4.

Figure 1:
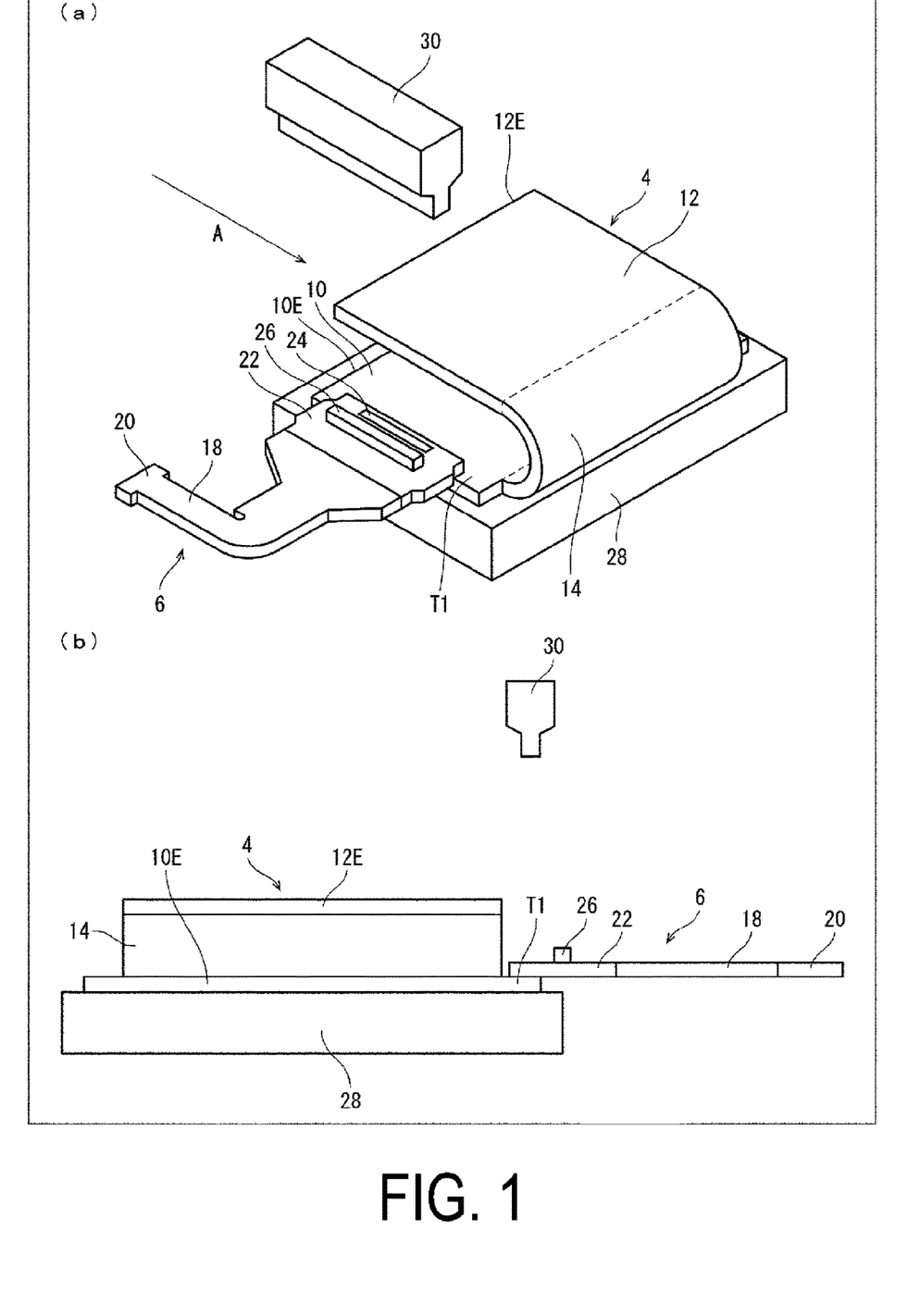
FIG. 1 illustrates a schematic perspective view and a schematic side view for illustrating a mounting process in a method for manufacturing a display device according to a first embodiment.

With reference to FIG. 1, in a method for manufacturing a display device 2 according to the present embodiment, a mounting process in which the FPC substrate 6 is mounted on the flexible display panel 4 to manufacture the display device 2 will be described. (a) of FIG. 1 is a schematic perspective view for illustrating a mounting process according to the present embodiment. (b) of FIG. 1 is a schematic side view illustrating a mounting process according to the present embodiment, and is a side view as viewed from a direction A illustrated in (a) of FIG. 1.

In the mounting process according to the present embodiment, a mounting stage 28 and a crimping tool 30 illustrated in FIG. 1 are used to mount the FPC substrate 6 on the flexible display panel 4. The mounting stage 28 is a stage on which the flexible display panel 4 is placed during mounting of the FPC substrate 6 onto the flexible display panel 4. The crimping tool 30 can move vertically with respect to the mounting stage 28. By pressing a tip of the heated crimping tool 30 to a position in which the frame terminal 8 in the first terminal region T1 and the counter terminal 24 of the COF substrate 22 overlap, as illustrated in FIG. 1, thermocompression bonding of the frame terminal 8 and the counter terminal 24 can be performed.

In the present embodiment, the mounting stage 28 is a stage for mounting a FPC substrate on a display panel of a known display device that is not foldable. Here, generally, the display panel of the foldable display device is larger in area than the display panel of the display device that is not foldable. Thus, in a case where the flexible display panel 4 of the display device 2 that is foldable is to be placed on the known mounting stage 28, the flexible display panel 4 cannot be placed entirely on the mounting stage 28. A portion of the flexible display panel 4 that could not be placed on the mounting stage 28 is pendent downward from an end portion of the mounting stage 28.

When a portion of the flexible display panel 4 is pendent from an end portion of the mounting stage 28, the flexible display panel 4 that is bent at the end portion of the mounting stage 28 results in a failure. Here, for example, it is conceivable to add an auxiliary stage to the mounting stage 28 to hold the flexible display panel 4 that could not be placed on the mounting stage 28. However, from physical constraints around the mounting stage 28, an auxiliary stage may not be able to be placed around the mounting stage 28.

In the present embodiment, as illustrated in FIG. 1, in a state in which the flexible display panel 4 is folded so that a portion of the flexible display panel 4 overlaps with the mounting stage 28 in plan view, mounting the FPC substrate 6 onto the flexible display panel 4 is performed. Specifically, in the mounting process, the folding portion 12 is folded over the abutting portion 10 in plan view.

In the state in which the folding portion 12 is folded over the abutting portion 10, the flexible display panel 4 abuts on the mounting stage 28 only at the abutting portion 10. In other words, in the present embodiment, the mounting process described above is performed in a state in which the curved portion 14 is curved and the flexible display panel 4 is folded.

In the state in which the flexible display panel 4 is folded, the notch 16 overlaps with the first terminal region T1. Thus, the first terminal region T1 is exposed from the flexible display panel 4 in plan view. Accordingly, the mounting process described above can be performed through the notch 16.

In the present embodiment, an area of the abutting portion 10 is larger than an area of the folding portion 12 due to the presence of the notch 16. Here, the distance from the end portion 10E of the flexible display panel 4 to the curved portion 14 is assumed to be the same as the distance from the end portion 12E to the curved portion 14. In this case, the mounting process is performed in a state in which the flexible display panel 4 is folded so that the end portion 12E of the flexible display panel 4 overlaps with the end portion 10E. In other words, in the present embodiment, in the mounting process, an area of the display region DA in the abutting portion 10 of the flexible display panel 4 and an area of the display region DA in the folding portion 12 are the same.

In the present embodiment, even in the state in which the flexible display panel 4 is folded, the frame region NA of the flexible display panel 4 is not present at a position overlapping the first terminal region T1. Thus, even when the flexible display panel 4 is folded, the crimping tool 30 can approach to a position in which the frame terminal 8 of the first terminal region T1 and the counter terminal 24 of the COF substrate 22 overlap.

In the present embodiment, the FPC substrate 6 is mounted on the flexible display panel 4 in a state in which the folding portion 12 of the flexible display panel 4 is folded. For this reason, the mounting described above can be performed even in a case in which the flexible display panel 4 cannot be placed entirely on the mounting stage 28. Thus, without adding an auxiliary stage or the like to the mounting stage 28, the known mounting stage 28 can be used in the manufacturing process of the display device 2 provided with the flexible display panel 4 with a large area, such as a display device that is foldable.

Figure 4:
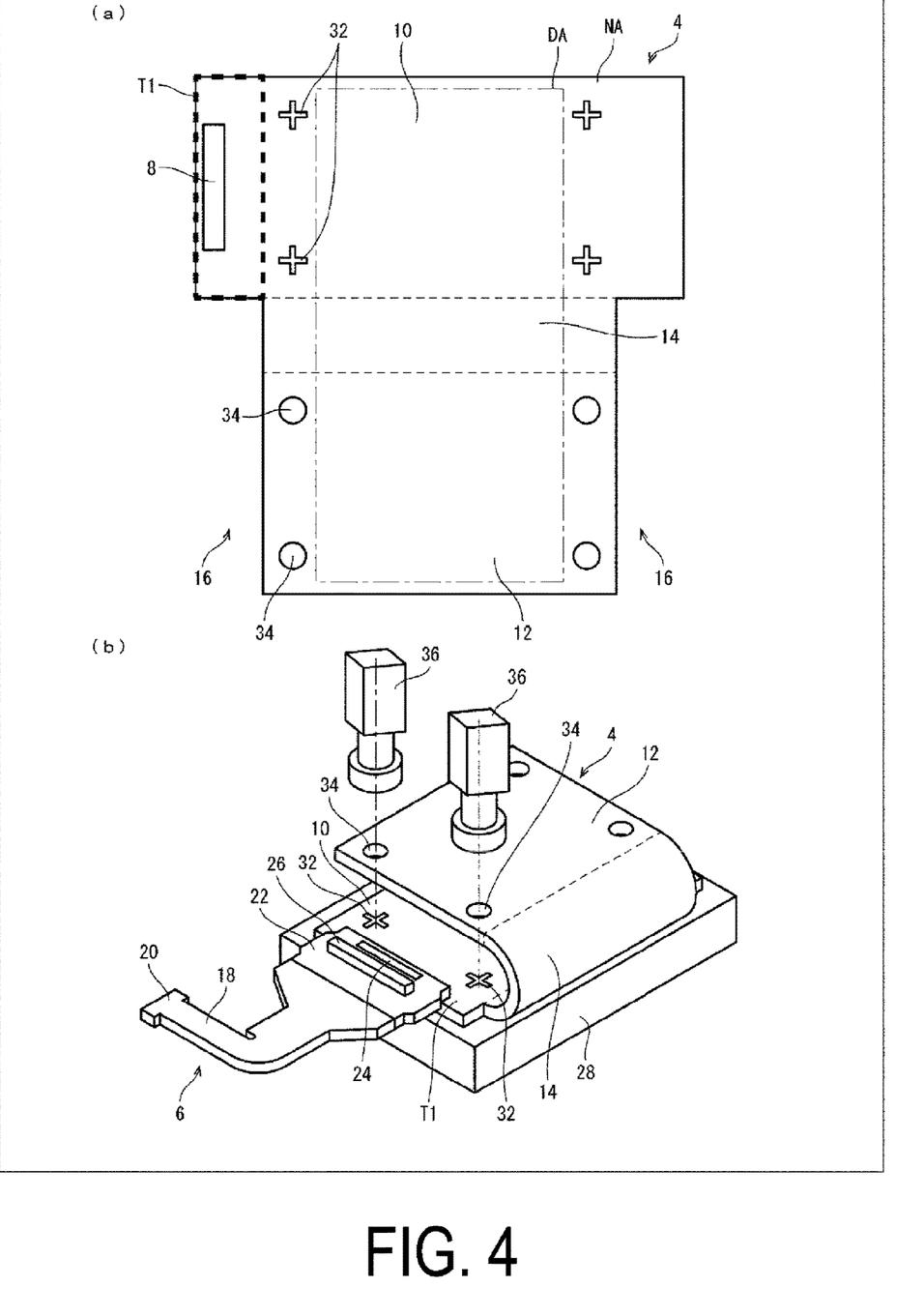
FIG. 4 illustrates a schematic top view of a flexible display panel and a schematic perspective view for illustrating an alignment process in a method for manufacturing a display device according to a second embodiment.

Second Embodiment (a) of FIG. 4 is a schematic top view illustrating the flexible display panel 4 provided in the display device 2 according to the present embodiment. Note that the display device 2 according to the present embodiment may have the same configuration as the display device 2 according to the previous embodiment except that the configuration of the flexible display panel 4 is different. In other words, the FPC substrate 6 provided in the display device 2 according to the present embodiment may be the same as the FPC substrate 6 provided in the display device 2 according to the previous embodiment.

In the present embodiment, the flexible display panel 4 includes at least one alignment mark 32 for mounting in the frame region NA in the abutting portion 10. In addition, in the present embodiment, the flexible display panel 4 includes openings 34, the number of which corresponds to the number of the alignment marks 32, in the frame region NA in the folding portion 12. Each opening 34 is formed at a position overlapping with each alignment mark 32 in the abutting portion 10 in a state in which the folding portion 12 is folded.

(b) of FIG. 4 is a schematic perspective view for illustrating an alignment process performed in advance of the mounting process of the display device 2 according to the present embodiment. The alignment process according to the present embodiment is a process in which alignment is performed to adjust relative positions of the flexible display panel 4 and the FPC substrate 6 for a mounting process that is performed thereafter.

Similar to the mounting process illustrated in FIG. 1, the alignment process is performed in a state in which the abutting portion 10 is abutted on the mounting stage 28 and the folding portion 12 is folded over the abutting portion 10, as illustrated in (b) of FIG. 4. In the alignment process, alignment of the flexible display panel 4 and the FPC substrate 6 is performed by observing the alignment mark 32 of the flexible display panel 4.

In the present embodiment, the observation of the alignment mark 32 is performed through the opening 34 overlapping with the alignment mark 32 in plan view, as illustrated in (b) of FIG. 4. The observation of the alignment mark 32 may be performed using a camera 36 disposed at a position overlapping with the alignment mark 32 and the opening 34 in plan view.

In the present embodiment, in a state in which the folding portion 12 is folded over the abutting portion 10, the alignment mark 32 is observed through the opening 34, and the alignment of the flexible display panel 4 and the FPC substrate 6 is performed. Thus, it is not necessary to form the alignment mark 32 in a position exposed from the folding portion 12 in plan view, and thus an appropriate alignment of the flexible display panel 4 and the FPC substrate 6 can be performed while reducing the area of the frame region NA.

Note that in the present embodiment, the configuration is not limited to the above embodiment, and the alignment mark 32 may be formed at a position overlapping with the notch 16 in a state in which the folding portion 12 is folded over the abutting portion 10. In this case, in the alignment process, the alignment mark 32 can be observed through the notch 16. Further, in a case in which the flexible display panel 4 is transparent, in the alignment process, the alignment mark 32 may be observed through the folding portion 12 of the flexible display panel 4 in a state in which the folding portion 12 is folded over the abutting portion 10.

Third Embodiment

Figure 5:
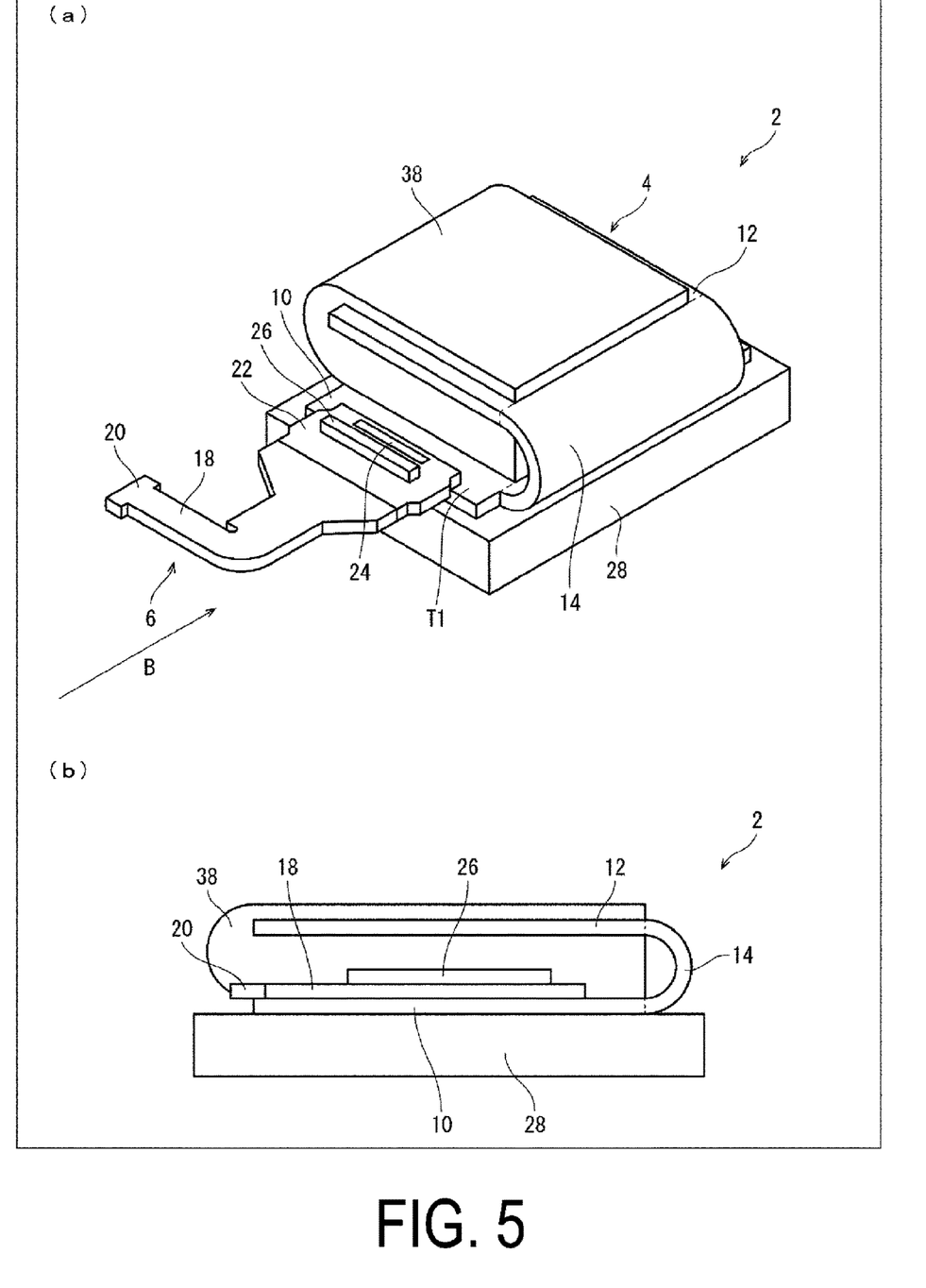
FIG. 5 illustrates a schematic perspective view and a schematic side view of a display device for illustrating the display device and a fixing member according to a third embodiment.

FIG. 5 is a diagram for illustrating a fixing member 38 for maintaining the state in which the flexible display panel 4 is folded in the manufacturing process of the display device 2 according to the present embodiment. (a) of FIG. 5 is a schematic perspective view of the display device 2 and the fixing member 38 illustrating the way to maintain the state in which the flexible display panel 4 is folded by the fixing member 38. Also, (b) of FIG. 5 is a schematic side view of the display device 2 and the fixing member 38 as viewed from a direction B in (a) of FIG. 5. Note that the display device 2 according to the present embodiment may have the same configuration as the display device 2 according to each of the previous embodiments.

In the present embodiment, the fixing member 38 is a member with a sheet shape having adhesiveness. As illustrated in each drawing of FIG. 5, the fixing member 38 adheres to a portion of the flexible display panel 4 on one surface of the abutting portion 10, and adheres to a portion of a front surface and a portion of a back surface of the folding portion 12. As a result, the fixing member 38 maintains a state in which the folding portion 12 of the flexible display panel 4 overlaps with the abutting portion 10 in plan view.

In the flexible display panel 4 in which its folded state is maintained by the fixing member 38, as illustrated in each drawing of FIG. 5, planes of the abutting portion 10 and the folding portion 12 are facing each other via the fixing member 38. Also, the fixing member 38 is disposed at a position that does not overlap with the first terminal region T1.

In the present embodiment, the mounting of the FPC substrate 6 onto the flexible display panel 4 is performed while maintaining the state in which the flexible display panel 4 is folded by the fixing member 38. Thus, an additional mechanism for holding the folding portion 12 is not required to be made, such as around the mounting stage 28, and the mounting apparatus and the like can be configured in a simple manner. Because the fixing member 38 does not overlap with the first terminal region T1, failures such as contact between the crimping tool 30 and the fixing member 38 can be reduced in the mounting process.

Further, in the present embodiment, placement of the flexible display panel 4 onto the mounting stage 28 and transfer to or from the other stages before and after the mounting process may be performed while maintaining the state in which the flexible display panel 4 is folded by the fixing member 38. As a result, while remaining in the state in which the flexible display panel 4 is folded, the placement of the flexible display panel 4 onto the stage or the transfer of the flexible display panel 4 between stages can be performed in a simple manner.

Fourth Embodiment

Figure 6:
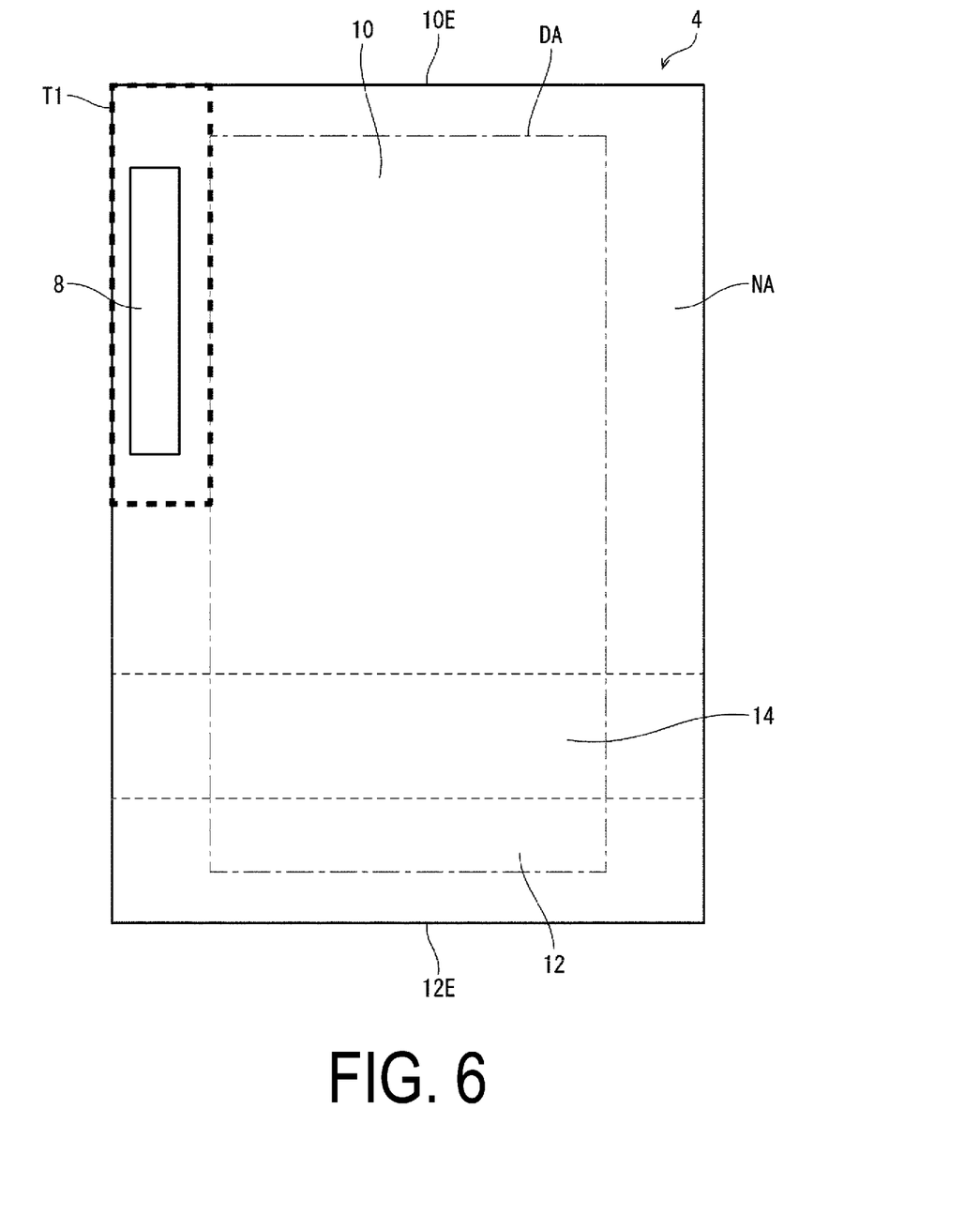
FIG. 6 illustrates a schematic top view of a flexible display panel according to a fourth embodiment.

FIG. 6 is a schematic top view illustrating the flexible display panel 4 provided in the display device 2 according to the present embodiment. Note that the display device 2 according to the present embodiment may have the same configuration as the display device 2 according to each of the previous embodiments except that the configuration of the flexible display panel 4 is different. In other words, the FPC substrate 6 provided in the display device 2 according to the present embodiment may be the same as the FPC substrate 6 provided in the display device 2 according to each of the previous embodiments.

In the present embodiment, the flexible display panel 4 does not include the notch 16. In the present embodiment, the frame region NA of the folding portion 12 is formed at the position where the notch 16 is formed in the flexible display panel 4 according to each of the previous embodiments. Thus, in the present embodiment, an outer shape of the flexible display panel 4 is rectangular.

In addition, in the present embodiment, the curved portion 14 is formed on the folding portion 12 side than the center of the flexible display panel 4. In other words, the distance from the end portion 10E of the flexible display panel 4 to the curved portion 14 is longer than the distance from the end portion 12E to the curved portion 14.

Except for the point described above, the flexible display panel 4 according to the present embodiment may have the same configuration as the flexible display panel 4 according to each of the previous embodiments.

Figure 7:
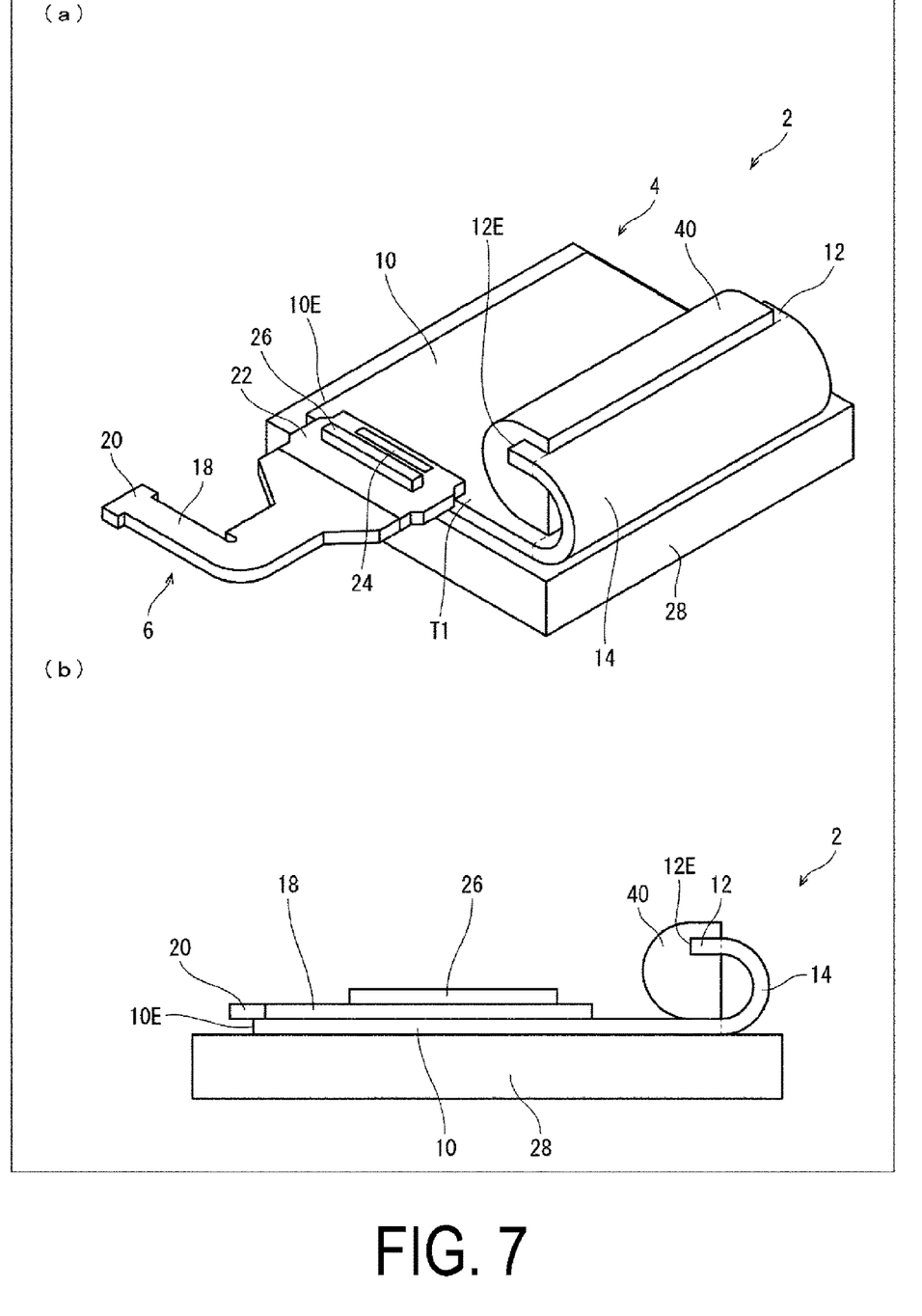
FIG. 7 illustrates a schematic perspective view and a schematic side view of a display device for illustrating the display device and a fixing member according to the fourth embodiment.

FIG. 7 is a diagram for illustrating a fixing member 40 for maintaining a state in which the flexible display panel 4 is folded in the manufacturing process of the display device 2 according to the present embodiment. (a) of FIG. 7 is a schematic perspective view of the display device 2 and the fixing member 40 illustrating the way to maintain the state in which the flexible display panel 4 is folded by the fixing member 40. Also, (b) of FIG. 7 is a schematic side view of the display device 2 and the fixing member 40 as viewed from a direction C in (a) of FIG. 7.

In the present embodiment, the fixing member 40 adheres to a portion on one surface of the abutting portion 10 and adheres to a portion of the front surface and a portion of the back surface of the folding portion 12, similar to the fixing member 38 in the previous embodiment. As a result, as illustrated in each drawing of FIG. 7, the fixing member 40 maintains a state in which the folding portion 12 is folded into a position overlapping with the abutting portion 10 in plan view.

Here, in the present embodiment, as illustrated in each drawing of FIG. 7, the folding portion 12 is folded so that the folding portion 12 does not overlap with the first terminal region T1 in plan view. Thus, in the present embodiment, the first terminal region T1 is exposed from the folding portion 12 even in the state in which the folding portion 12 is folded into a position overlapping with the abutting portion 10 in plan view.

Thus, in the present embodiment, the mounting process is performed in a state in which the flexible display panel 4 is folded so that the end portion 12E of the flexible display panel 4 overlaps on the curved portion 14 side than the end portion 10E. In other words, in the present embodiment, in the mounting process, an area of the display region DA in the abutting portion 10 is larger than an area of the display region DA in the folding portion 12 of the flexible display panel 4.

In the present embodiment as well, similar to the previous embodiment, an additional mechanism for holding the folding portion 12 is not required to be made, such as around the mounting stage 28, and the mounting apparatus and the like can be configured in a simple manner. In addition, in the present embodiment, it is not necessary to form the notch 16 in the flexible display panel 4, and the flexible display panel 4 can be configured in a simple manner.

Figure 8:
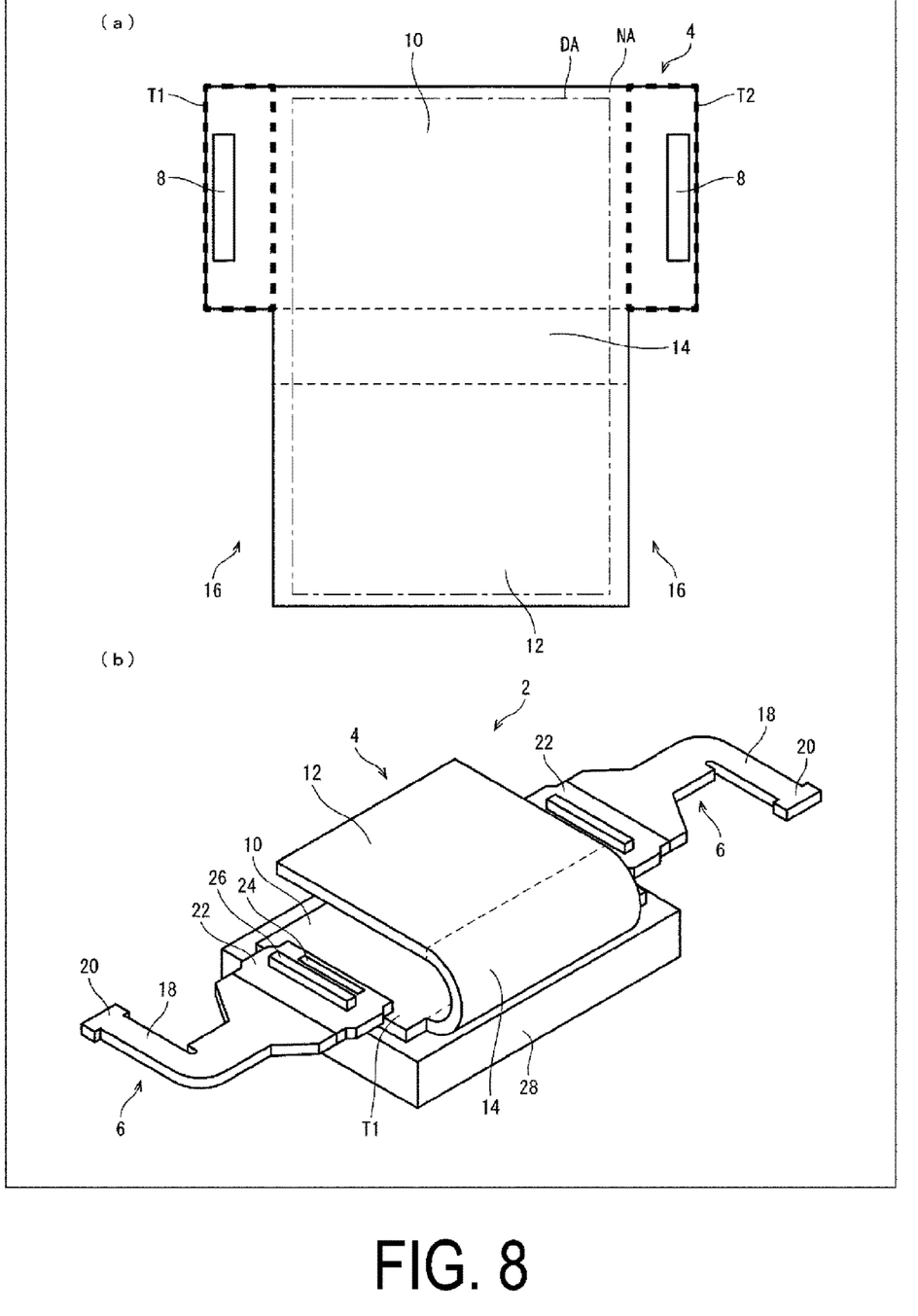
FIG. 8 illustrates a schematic top view of a flexible display panel and a schematic perspective view of a display device according to a fifth embodiment.

Fifth Embodiment (a) of FIG. 8 is a schematic top view illustrating the flexible display panel 4 provided in the display device 2 according to the present embodiment. Note that the display device 2 according to the present embodiment may have the same configuration as the display device 2 according to the previous embodiment except that the configuration of the flexible display panel 4 is different and that the number of the FPC substrate 6 is different. In other words, each FPC substrate 6 provided in the display device 2 according to the present embodiment may be the same as the FPC substrate 6 provided in the display device 2 according to the previous embodiment.

In the present embodiment, the flexible display panel 4 includes a second terminal region T2 on a second side of the frame region NA in the abutting portion 10 facing a first side in which the first terminal region T1 is formed, as illustrated in (a) of FIG. 8. The second terminal region T2 includes the frame terminal 8, similar to the first terminal region T1. Also, the notch 16 is formed in the frame region NA of the folding portion 12 adjacent to the second terminal region T2.

(b) of FIG. 8 is a schematic perspective view for illustrating a state in which the flexible display panel 4 of the display device 2 according to the present embodiment is placed on the mounting stage 28. In the present embodiment, the display device 2 includes one FPC substrate 6 mounted on the first terminal region T1 and the other FPC substrate 6 mounted on the second terminal region T2, of the flexible display panel 4.

In the present embodiment, as illustrated in (b) of FIG. 8, while the display device 2 is placed on the mounting stage 28, the folding portion 12 of the flexible display panel 4 is folded into a position overlapping with the abutting portion 10 in plan view. In the present embodiment, in this folded state, the mounting process of the FPC substrate 6 onto the first terminal region T1 and the mounting process of the FPC substrate 6 onto the second terminal region T2 are performed.

In other words, while the mounting process of the FPC substrate 6 onto the first terminal region T1 is being performed, the abutting portion 10 includes the second terminal region T2. Note that the second terminal region T2 is exposed from the folding portion 12 even in a state in which the folding portion 12 of the flexible display panel 4 is folded into a position overlapping with the abutting portion 10. As a result, both the mounting process of the FPC substrate 6 onto the first terminal region T1 and the mounting process of the FPC substrate 6 onto the second terminal region T2 can be performed in a simple manner.

In the present embodiment, the display device 2 includes two FPC substrates 6, and thus a portion of wiring lines for transmitting signals to the plurality of signal lines can be distributed to each FPC substrate 6. Generally, the display device that is foldable has an increased number of signal lines, such as data signal lines, and of wiring lines connected to the signal lines, compared to known display devices. Thus, it is advantageous that the display device 2 includes two FPC substrates 6 when designing the display device 2 as a foldable device.

Sixth Embodiment

Figure 9:
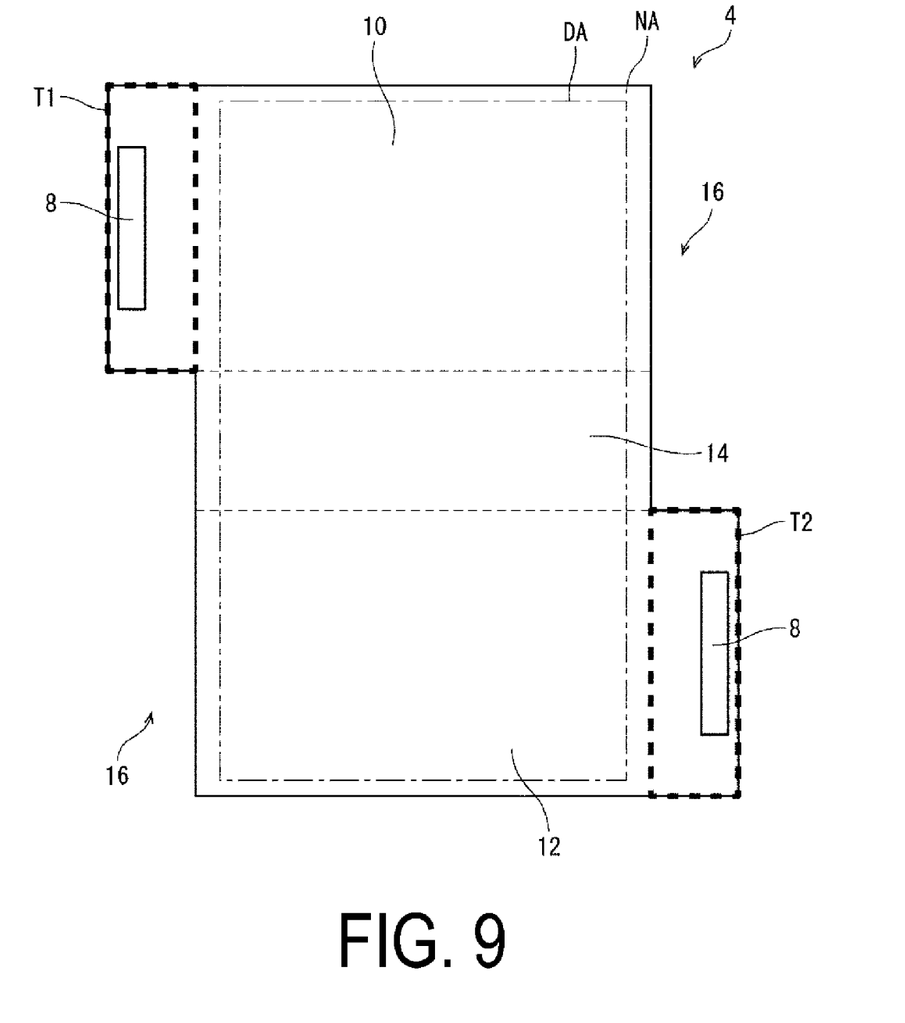
FIG. 9 illustrates a schematic top view of a flexible display panel according to a sixth embodiment.

FIG. 9 is a schematic top view illustrating the flexible display panel 4 provided in the display device 2 according to the present embodiment. Note that the display device 2 according to the present embodiment may have the same configuration as the display device 2 according to the previous embodiment except that the configuration of the flexible display panel 4 is different. In other words, each FPC substrate 6 provided in the display device 2 according to the present embodiment may be the same as each FPC substrate 6 provided in the display device 2 according to the previous embodiment.

In the present embodiment, as illustrated in FIG. 9, the flexible display panel 4 includes the second terminal region T2 on one side of the frame region NA in the folding portion 12 facing one side of the frame region NA in the abutting portion 10 in which the first terminal region T1 is formed. In the present embodiment, the notches 16 are formed each in the frame region NA in the folding portion 12 adjacent to the first terminal region T1 and the frame region NA in the abutting portion 10 adjacent to the second terminal region T2, respectively. Note that the first terminal region T1 and the second terminal region T2 may have the same configuration as the first terminal region T1 and the second terminal region T2 according to the previous embodiment.

In the present embodiment, as illustrated in FIG. 9, the flexible display panel 4 includes the first terminal region T1 and the second terminal region T2 each on opposing corners of the flexible display panel 4. In other words, the first terminal region T1 and the second terminal region T2 are diagonally disposed in the flexible display panel 4.

In this case, in a state where the flexible display panel 4 is curved and folded in the curved portion 14, the first terminal region T1 overlaps with the notch 16 of the folding portion 12, and the second terminal region T2 overlaps with the notch 16 of the abutting portion 10. Thus, in the present embodiment, in the mounting process in the first terminal region T1, the FPC substrate 6 may be mounted to the first terminal region T1 through the notch 16 of the folding portion 12.

In the present embodiment, the mounting process in the second terminal region T2 may be performed in a state in which the abutting portion 10 and the folding portion 12 of the flexible display panel 4 are inverted and the folding portion 12 including the second terminal region T2 is abutted on the mounting stage 28. The inversion of the abutting portion 10 and the folding portion 12 may be performed by flipping the flexible display panel 4 in its folded state on the same mounting stage 28. Also, the inversion of the abutting portion 10 and the folding portion 12 may be performed by flipping the flexible display panel 4 in its folded state when transferring the flexible display panel 4 to the other mounting stage 28.

In the present embodiment as well, similar to the previous embodiment, the display device 2 includes two FPC substrates 6, and thus a portion of wiring lines for transmitting signals to the plurality of signal lines can be distributed to each FPC substrate 6.

Figure 10:
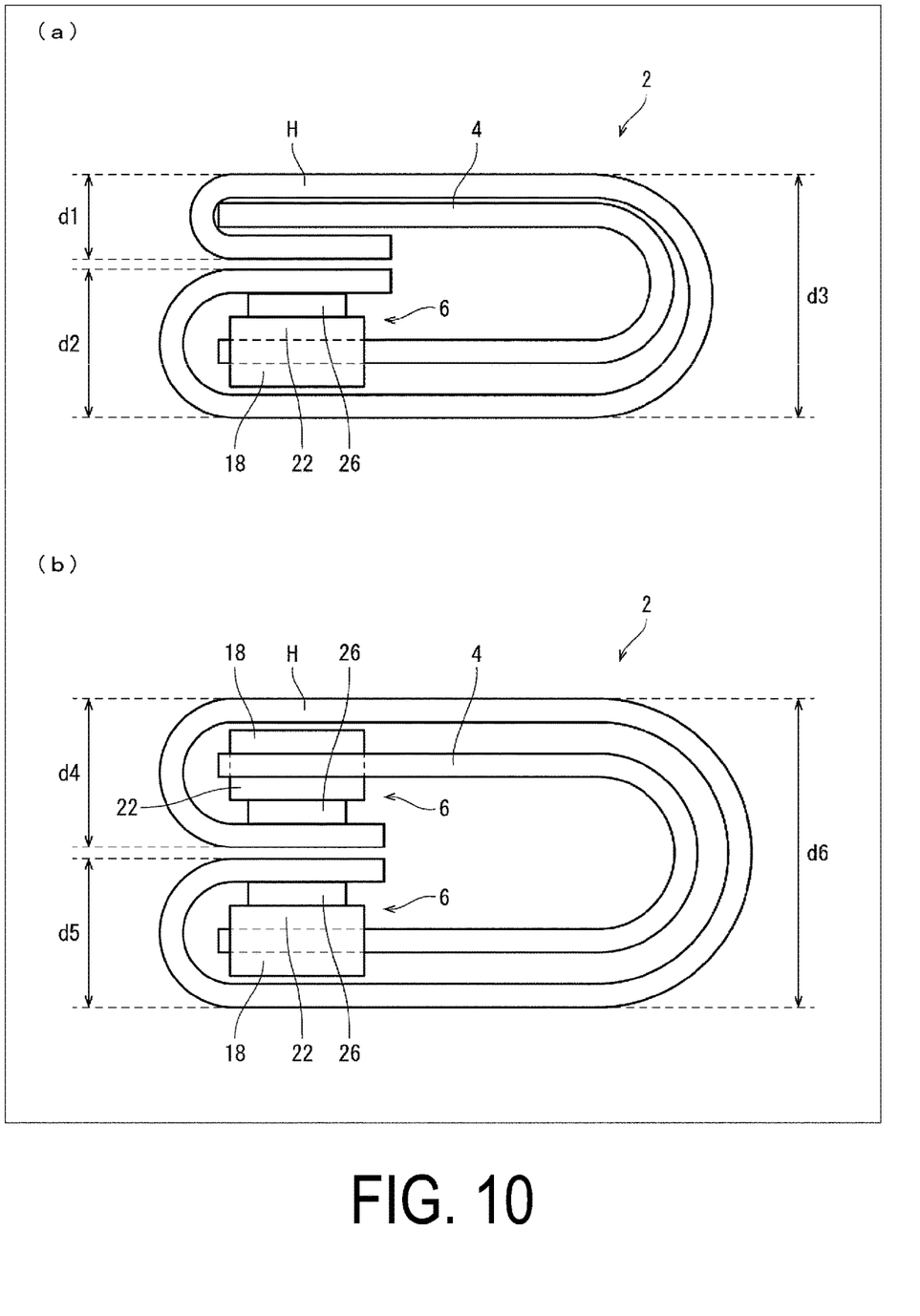
FIG. 10 illustrates a schematic side view illustrating a display device stored in a housing in a folded state, according to the fifth and sixth embodiments.

FIG. 10 illustrates side views illustrating the display device 2 according to the embodiment illustrated in FIG. 8 and the display device 2 according to the embodiment illustrated in FIG. 9, which are designed as a foldable display device, each in a state in which the foldable display device is folded. In FIG. 10, an axis of folding each foldable display device is on the right side toward the page surface. (a) of FIG. 10 is a cross-sectional view of the display device 2 according to the embodiment illustrated in FIG. 8, and (b) of FIG. 10 is a cross-sectional view of the display device 2 according to the embodiment illustrated in FIG. 9.

When the display device 2 according to each of the previous embodiments is designed as an actual foldable display device, the flexible film 18 of the FPC substrate 6 may be folded back to the back surface side of the flexible display panel 4. It is also conceived that the display device 2 is stored in a housing H illustrated in FIG. 10.

As illustrated in FIG. 10, the housing H is formed in a position covering the back surface of the flexible display panel 4 including the flexible film 18 and the COF substrate 22 including the IC chip 26, of the display device 2.

Here, in the case of the display device 2 according to the embodiment illustrated in FIG. 8, the housing H may be formed covering the FPC substrate 6 formed on one side of the flexible display panel 4. In addition, the housing H may cover only the flexible display panel 4 on the other side facing the one side with the region where the flexible display panel 4 curves interposed therebetween. Accordingly, a thickness d1 of the housing H on the other side is thinner than a thickness d2 of the housing H on the one side. With the state in which the display device 2 is folded, the housing H of the display device 2 has a total thickness d3.

On the other hand, in the case of the display device 2 according to the embodiment illustrated in FIG. 9, the housing H needs to cover not only the FPC substrate 6 formed on the one side of the flexible display panel 4 but also the FPC substrate 6 formed on the other side described above. Accordingly, a thickness d4 of the housing H on the other side is substantially the same thickness as a thickness d5 of the housing H on the one side. Thus, with the state in which the display device 2 is folded, a total thickness d6 of the housing H of the display device 2 is thicker than the total thickness d3.

As described above, the display device 2 according to the embodiment illustrated in FIG. 8 is preferable from the perspective of the reduction in the total thickness of the device when stored in the housing H and designed as a foldable display device, compared to the display device 2 according to the embodiment illustrated in FIG. 9.

Note that in FIG. 10, a case is illustrated in which the display device 2 is folded so that the display surface of the flexible display panel 4 is hidden, that is, the display surface of the flexible display panel 4 is inside the housing H. However, in the present embodiment, the display device 2 may be folded so that the display surface of the flexible display panel 4 can be observed, that is, the display surface of the flexible display panel 4 is outside the housing H.

Figure 11:
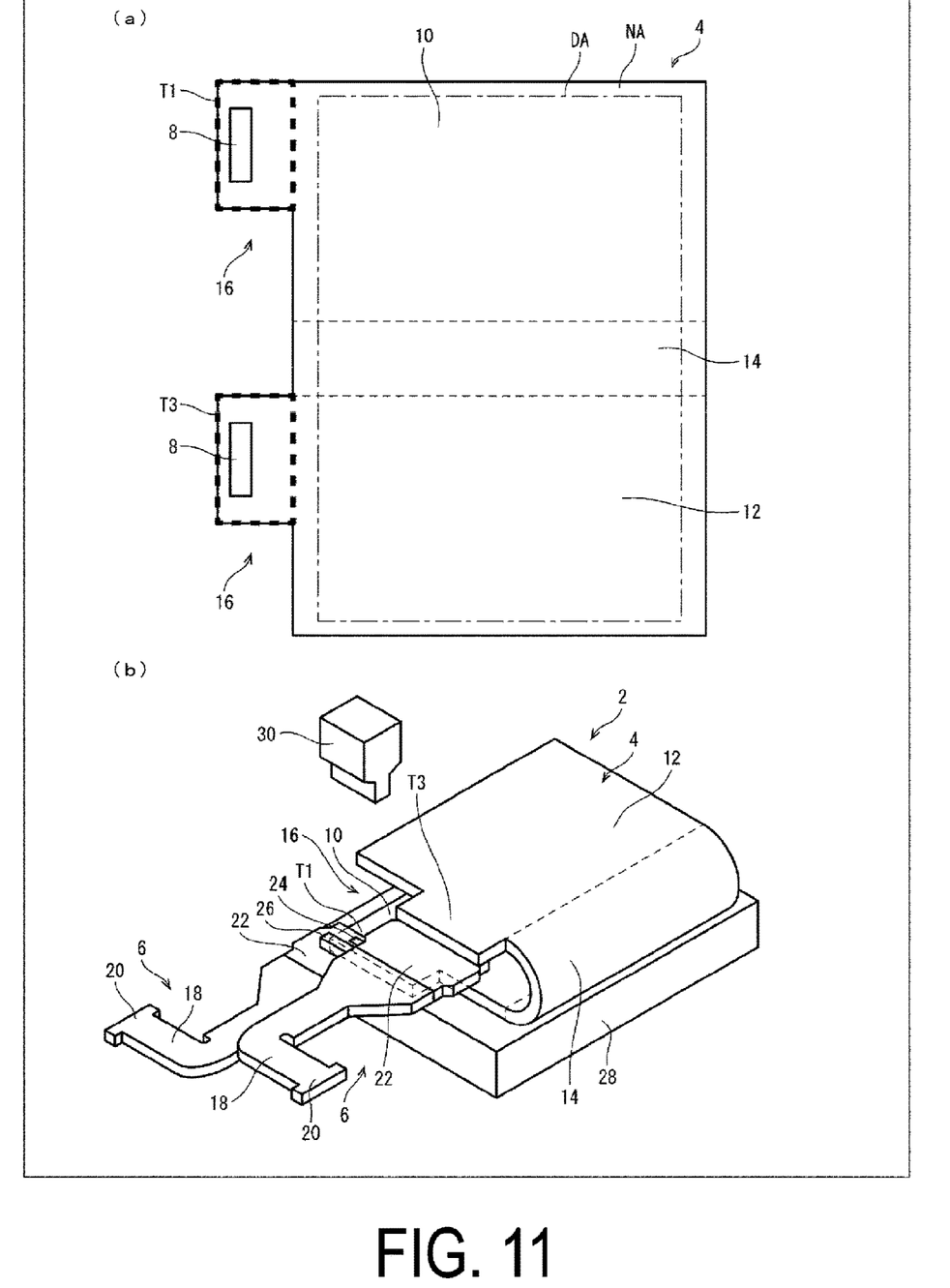
FIG. 11 illustrates a schematic top view of a flexible display panel and a schematic perspective view for illustrating a mounting process in a method for manufacturing a display device, according to a seventh embodiment.

Seventh Embodiment (a) of FIG. 11 is a schematic top view illustrating the flexible display panel 4 provided in the display device 2 according to the present embodiment. Note that the display device 2 according to the present embodiment may have the same configuration as the display device 2 according to the previous embodiment except that the configuration of the flexible display panel 4 is different. In other words, each FPC substrate 6 provided in the display device 2 according to the present embodiment may be the same as each FPC substrate 6 provided in the display device 2 according to the previous embodiment.

In the present embodiment, as illustrated in (a) of FIG. 11, the flexible display panel 4 includes a third terminal region T3 in the frame region NA in the folding portion 12 on the same side as the side of the frame region NA provided with the first terminal region T1. The third terminal region T3 includes the frame terminal 8, similar to the first terminal region T1. Also, in the present embodiment, the notches 16 are provided each in the frame region NA in the abutting portion 10 adjacent to the first terminal region T1 and the frame region NA in the folding portion 12 adjacent to the third terminal region T3, respectively.

(b) of FIG. 11 is a schematic perspective view for illustrating a mounting process of the display device 2 according to the present embodiment in the first terminal region T1.

The first terminal region T1 is formed on a side of the frame region NA of the abutting portion 10 closer to an end portion of the flexible display panel 4 when viewed from the curved portion 14. Also, the third terminal region T3 is formed on the curved portion 14 side of the frame region NA in the folding portion 12. Thus, as illustrated in (b) of FIG. 11, in a case in which the folding portion 12 is folded into a position overlapping with the abutting portion 10 in plan view, the first terminal region T1 overlaps with the notch 16 of the folding portion 12, and the third terminal region T3 overlaps with the notch 16 of the abutting portion 10.

That is, when the folding portion 12 is folded into a position overlapping with the abutting portion 10 in plan view, the first terminal region T1 is exposed from the folding portion 12 through the notch 16 of the folding portion 12. Thus, in the present embodiment, in the mounting process in the first terminal region T1, the FPC substrate 6 can be mounted on the first terminal region T1 through the notch 16 of the folding portion 12.

In the present embodiment, the mounting process in the third terminal region T3 may be performed in a state in which the abutting portion 10 and the folding portion 12 of the flexible display panel 4 are inverted and the folding portion 12 including the third terminal region T3 is abutted on the mounting stage 28. Here, for the same reasons as described above, the FPC substrate 6 can be mounted on the third terminal region T3 through the notch 16 of the abutting portion 10 in the mounting process in the third terminal region T3.

In the present embodiment as well, similar to the previous embodiment, the display device 2 includes two FPC substrates 6, and thus a portion of wiring lines for transmitting signals to the plurality of signal lines can be distributed to each FPC substrate 6. Also, in the present embodiment, a plurality of the FPC substrates 6 can be formed on the same side of the flexible display panel 4, and the display device 2 can be configured in a simpler manner.

In each of the previous embodiments, the curve direction of the curved portion 14 may be shifted by 90 degrees. In other words, in each embodiment, a case has been described in which a terminal region is formed in the frame region NA of a side including the abutting portion 10, the curved portion 14, and the folding portion 12; however, each embodiment is not limited thereto. In each embodiment, for example, a terminal region may be formed on the frame region NA of the side of the abutting portion 10 facing the folding portion 12 with the curved portion 14 interposed therebetween.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a display device including a flexible display panel and a flexible printed circuit substrate, the flexible display panel including a display region and a frame region, the frame region including, on a first side thereof, a first terminal region in which a frame terminal is provided, the display region including a scanning signal line and a data signal line, the flexible printed circuit substrate including a counter terminal, the method for manufacturing the display device comprising:

a mounting process in which the frame terminal and the counter terminal are electrically connected by thermocompression bonding, wherein, in the mounting process, the thermocompression bonding is performed in a state in which the flexible display panel is folded so that the flexible display panel includes an abutting portion abutting on a mounting stage and a folding portion where the flexible display panel is to be folded over the abutting portion in plan view.

2. The method for manufacturing the display device according to claim 1, wherein the flexible display panel includes a notch in the frame region facing the first terminal region allowing the first terminal region to be exposed in the state in which the flexible display panel is folded in the mounting process, and in the mounting process, the thermocompression bonding is performed through the notch in the frame region in the folding portion.

3. The method for manufacturing the display device according to claim 1, wherein the mounting process includes an alignment process before the thermocompression bonding is performed, and in the alignment process, in the state in which the flexible display panel is folded, alignment of the frame terminal and the counter terminal is performed by observing an alignment mark for mounting provided on the frame region in the abutting portion through a notch or an opening in the frame region in the folding portion.

4. The method for manufacturing the display device according to claim 1, wherein the mounting process includes an alignment process before the thermocompression bonding is performed, and in the alignment process, in the state in which the flexible display panel is folded, alignment of the frame terminal and the counter terminal is performed by observing an alignment mark for mounting provided on the frame region in the abutting portion through the frame region in the folding portion.

5. The method for manufacturing the display device according to claim 1, wherein, in the mounting process, the state in which the flexible display panel is folded is maintained by a fixing member.

6. The method for manufacturing the display device according to claim 5,
wherein the fixing member is a member with a sheet shape having adhesiveness, and
in the mounting process, planes of the abutting portion and the folding portion face each other via the fixing member.

7. The method for manufacturing the display device according to claim 5,
wherein the fixing member covers a front surface and a back surface of the folding portion.

8. The method for manufacturing the display device according to claim 5,
wherein a terminal region provided in the abutting portion and the fixing member do not overlap.

9. The method for manufacturing the display device according to claim 5,
wherein, in the mounting process, placement of the flexible display panel onto a stage and transfer of the flexible display panel between stages are performed while the state in which the flexible display panel is folded is maintained by the fixing member.

10. The method for manufacturing the display device according to claim 1,
wherein, in the mounting process, an area of the display region in the abutting portion is larger than an area of the display region in the folding portion.

11. The method for manufacturing the display device according to claim 1,
wherein, in the mounting process, an area of the display region in the abutting portion is equal to an area of the display region in the folding portion.

12. The method for manufacturing the display device according to claim 1,
wherein, in the mounting process, the frame region includes, on a second side thereof facing the first side, a second terminal region, and
in a process in which the thermocompression bonding is performed in the first terminal region, the abutting portion includes the second terminal region.

13. The method for manufacturing the display device according to claim 1,
wherein, in the mounting process, the frame region includes, on a second side thereof facing the first side, a second terminal region, and
in a process in which the thermocompression bonding is performed in the first terminal region, the folding portion includes the second terminal region.

14. The method for manufacturing the display device according to claim 1,
wherein the frame region includes, on a side identical to the first side, a third terminal region,
in the mounting process, in a process in which the thermocompression bonding is performed in the first terminal region, the folding portion includes the third terminal region, and
the thermocompression bonding is performed through a notch in the frame region in the folding portion allowing the first terminal region to be exposed in the state in which the flexible display panel is folded.

15. The method for manufacturing the display device according to claim 1,
wherein each of the abutting portion and the folding portion includes the display region, and each of the display regions includes the scanning signal line in common.

* * * * *